United States Patent [19]

Koomen et al.

[11] 4,420,822

[45] Dec. 13, 1983

[54] FIELD PLATE SENSING IN SINGLE TRANSISTOR, SINGLE CAPACITOR MOS RANDOM ACCESS MEMORY

[75] Inventors: Joannes J. M. Koomen, Waalre; Roelof H. W. Salters, Geldrop, both of Netherlands

[73] Assignee: Signetics Corporation, Sunnyvale, Calif.

[21] Appl. No.: 360,088

[22] Filed: Mar. 19, 1982

[51] Int. Cl.³ .............................................. G11C 11/40
[52] U.S. Cl. ..................................... 365/182; 307/449
[58] Field of Search ...................... 365/174, 182, 189; 307/449

[56] References Cited

U.S. PATENT DOCUMENTS

| | | |
|---|---|---|
| 3,760,381 | 9/1973 | Yao . |
| 3,949,382 | 4/1976 | Yasui . |
| 4,025,907 | 5/1977 | Karp et al. . |
| 4,027,294 | 5/1977 | Meusburger et al. . |
| 4,031,522 | 6/1977 | Reed et al. . |

FOREIGN PATENT DOCUMENTS 2646245 5/1977 Fed. Rep. of Germany .
2659248 7/1977 Fed. Rep. of Germany .

Primary Examiner—Terrell W. Fears
Attorney, Agent, or Firm—J. Dinardo; R. Meetin; T. Briody

[57] ABSTRACT

In a memory cell array of the kind including a memory cell capacitor and a memory cell transistor connected in series between a field plate line and a bit line, both the field plate line and bit line are precharged to the same potential level. The field plate line is connected to one input of a sense amplifier and the bit line is connected to the other input. The charge and discharge of the memory cell capacitor causes equal and opposite voltage changes on the field plate line and bit line. With respect to prior art the cell signal is increased by the amount of signal on the field plate line and when sensed against a reference signal which is about one-half the amount of the cell signal, the sensed signal is about twice that obtainable in the prior art.

6 Claims, 4 Drawing Figures

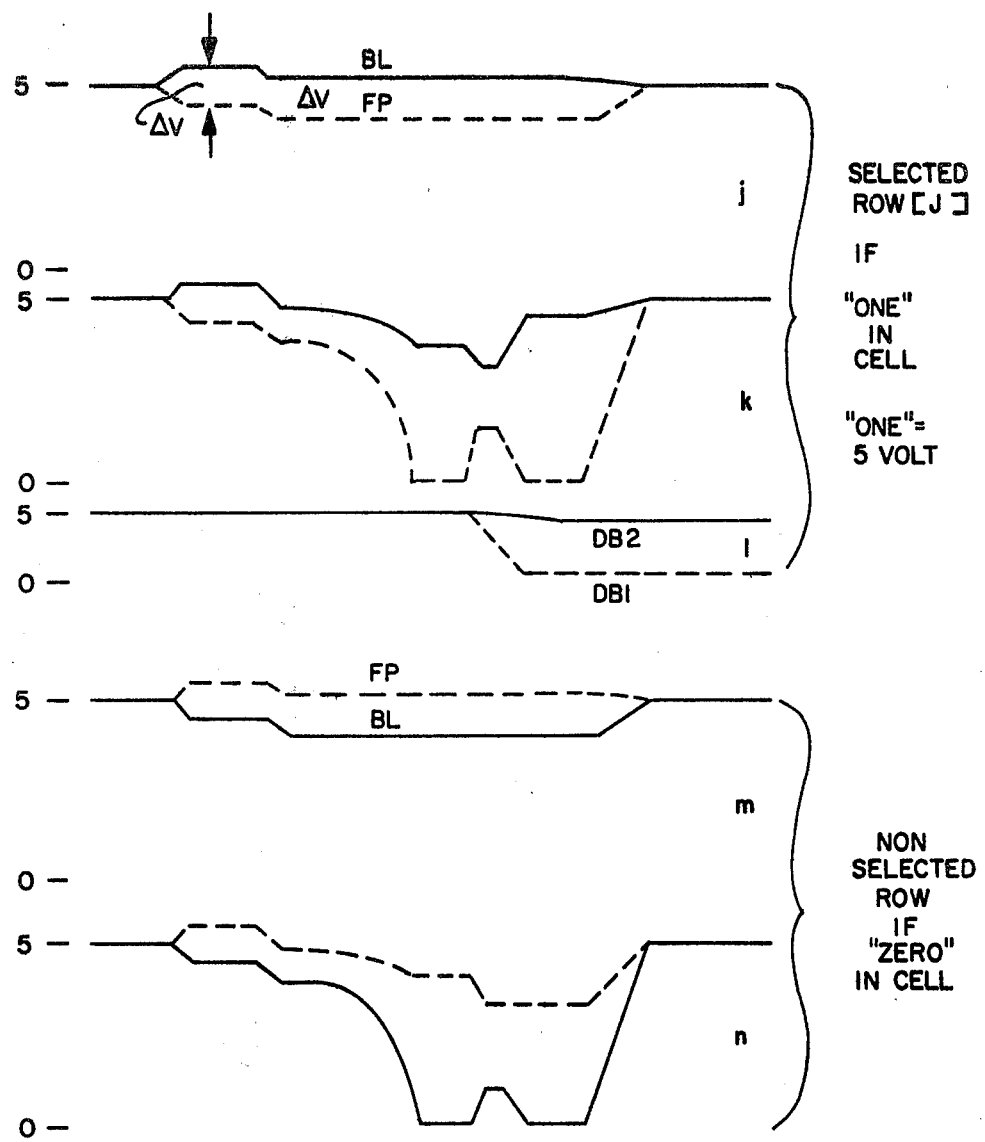
Fig. 2 (con't)

4,420,822

FIELD PLATE SENSING IN SINGLE TRANSISTOR, SINGLE CAPACITOR MOS RANDOM ACCESS MEMORY

BACKGROUND OF THE INVENTION

This invention relates to metal oxide semiconductor (MOS) random access memories (RAMS) in which the memory cell has a single MOS transistor and a single capacitor connected in series and having twice the sensed signal of conventional arrangements.

In the usual MOS RAM utilizing a single capacitor and a single MOS transistor in a memory cell, one side of the capacitor, the side referred to as the field plate, is conventionally connected directly to the power line, and the sensing is accomplished by charging and discharging of the capacitor on the opposite side through a switch driven by the word line into a bit line that is precharged to a certain voltge level. The small change in the bit line voltage due to charging and discharging of the capacitor is sensed in a sense amplifier against a reference signal. The reference signal is roughly one half the value of the cell signal caused by the charge and discharge of the cell capacitor, so the sensed signal is one half of the cell signal.

SUMMARY OF THE INVENTION

According to the invention, the field plate is not connected directly to a fixed potential, but instead is precharged to a voltage level exactly equal to that to which the bit line is precharged. Furthermore, the field plate is connected to the other input of the sense amplifier, the bit line being connected to the normal input in the usual way. The charge and discharge of the cell capacitor not only causes a small voltage change on the bit line, but also a small equal and opposite change on the field plate. Therefore, the cell signal is increased by the amount of signal on the field plate, and will be roughly twice the cell signal resulting from the conventional arrangement. As in the conventional arrangement, this cell signal is sensed against a reference signal which is roughly one half the amount of the cell signal, and thus the sensed signal is twice that of the sensed signal obtained in the conventional arrangement.

DETAILED DESCRIPTION OF THE PREFERRED EMBODIMENT

Figure 1:
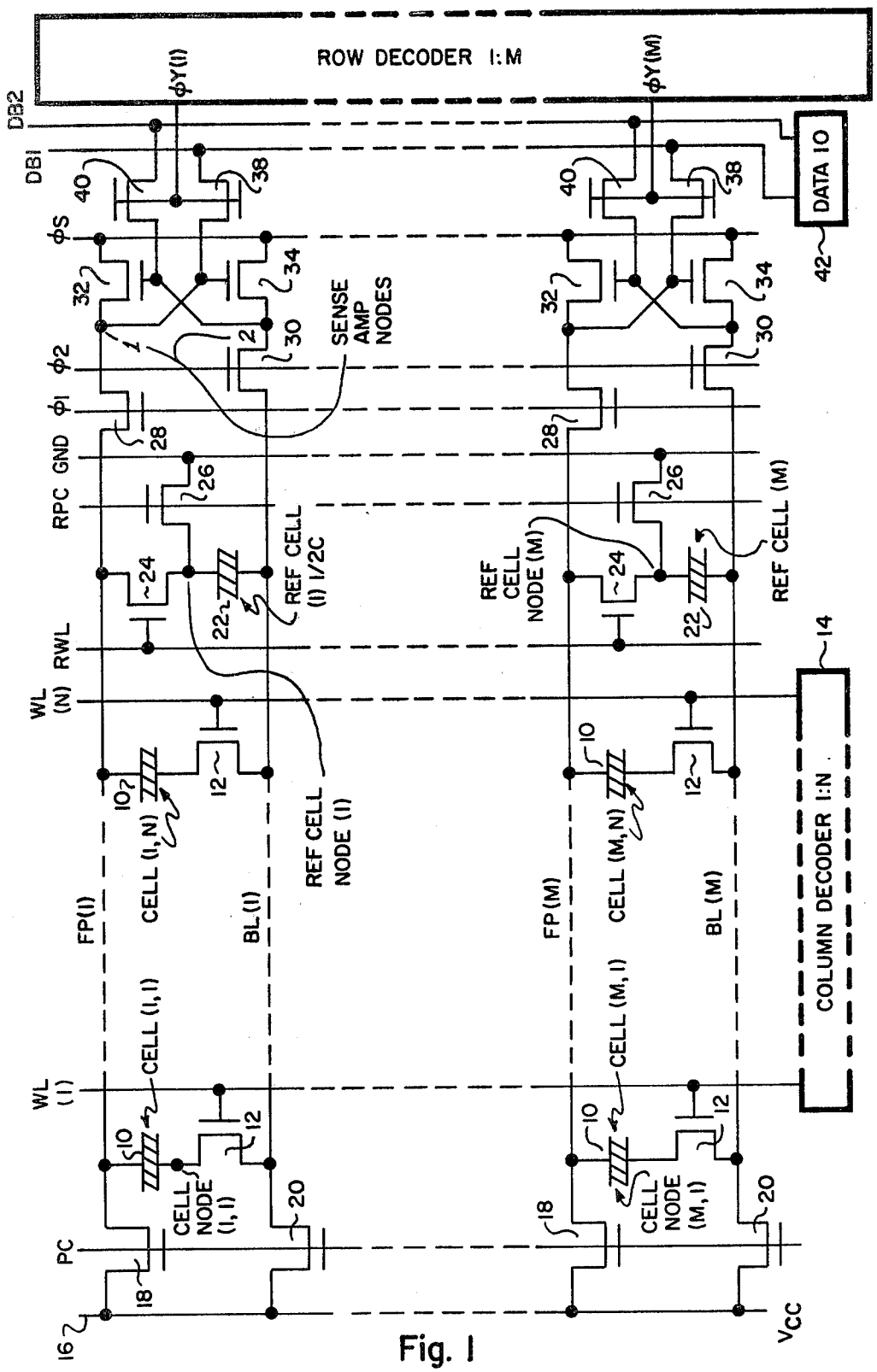
FIG. 1 is a schematic diagram of a memory cell array showing the field plate sensing arrangement according to the invention.

In FIG. 1, there is shown a memory array of an M number of rows of field plate lines FP and bit lines BL. Each row contains an N number of memory cells, each of which cells includes a capacitor 10 and a transistor 12 coupled in series between the field plate line FP and bit line BL, respectively. Thus, one side of the memory cell capacitor 10 is connected directly to the field plate line FP, and the other side of the capacitor 10 is connected to or disconnected from the bit line BL through the memory cell transistor 12.

The gates of the transistors 12 in a given column are all connected to one of a number of word lines WL, there being one word line WL for each of the N columns of memory cells. The word lines WL may be selectively actuated by signals fed from a column decoder 14 so that upon actuation of a given word line WL, all of the transistors 10 in the column will be connected to the bit lines BL.

The field plate lines FP are each connected to or disconnected from a power supply rail 16 through a precharge transistor 18. Each of the bit lines BL are also connected or disconnected from the power supply rail 16 through another precharge transistor 20. The precharge transistors 18 and 20 are switched on or off by a signal applied to a precharge line PC connecting the gates of the transistors 18 and 20.

Each row contains a reference cell which includes a reference capacitor 22 and a reference transistor 24 connected in series between the bit line BL and the field plate line FP. It is essential that opposite to the cell configuration 10, 12 the reference cell 22 is connected to the bit line BL and the reference transistor 24 is connected to the field plate line FP. The gates of the reference transistor 24 are connected to a reference word line RWL. A switching transistor 26 is connected between each reference cell node, the junction between reference capacitor 22 and reference transistor 24, and a ground line GND. A reference cell preset line RPC connecting all the gates of the switching transistors 26 is used to reset the reference cells to zero volts. The capacitors of the reference cell capacitor 22 has a value $\frac{1}{2}C$ that is $\frac{1}{2}$ the value C of the capacitance of the memory cell capacitor 10.

Each field plate line RP of a row is coupled to one node 1 of a sense amplifier through a connecting transistor 28. Similarly, each bit line BL of a row is coupled to the other node 2 of the sense amplifier through another connecting transistor 30. The connect and reconnect lines $\phi 1$ and $\phi 2$ connecting the gates of the transistors 28 and 30 respectively, serve as connects and reconnects of the field plate lines FP and bit lines BL to the sense amplifier nodes 1 and 2. The sense amplifier is a cross coupled transistor pair 32 and 34. The sides of the sense amplifier transistors opposite the nodes 1 and 2 are connected to a sense amplifier pulldown line $\phi S$.

The sense amplifier nodes 1 and 2 of only one row are connected to a pair of data buses DB1 and DB2 by a decoded pulse selected from M number of lines $\phi Y$ emanating from a row decoder 36. This is accomplished by feeding the decoded pulse to the gates of transistors 38 and 40 connected between the sense amplifier nodes 1 and 2 and the data bus pair DB1 and DB2. The data buses DB1 and DB2 connect to data input/output circuitry 42.

Figure 2:
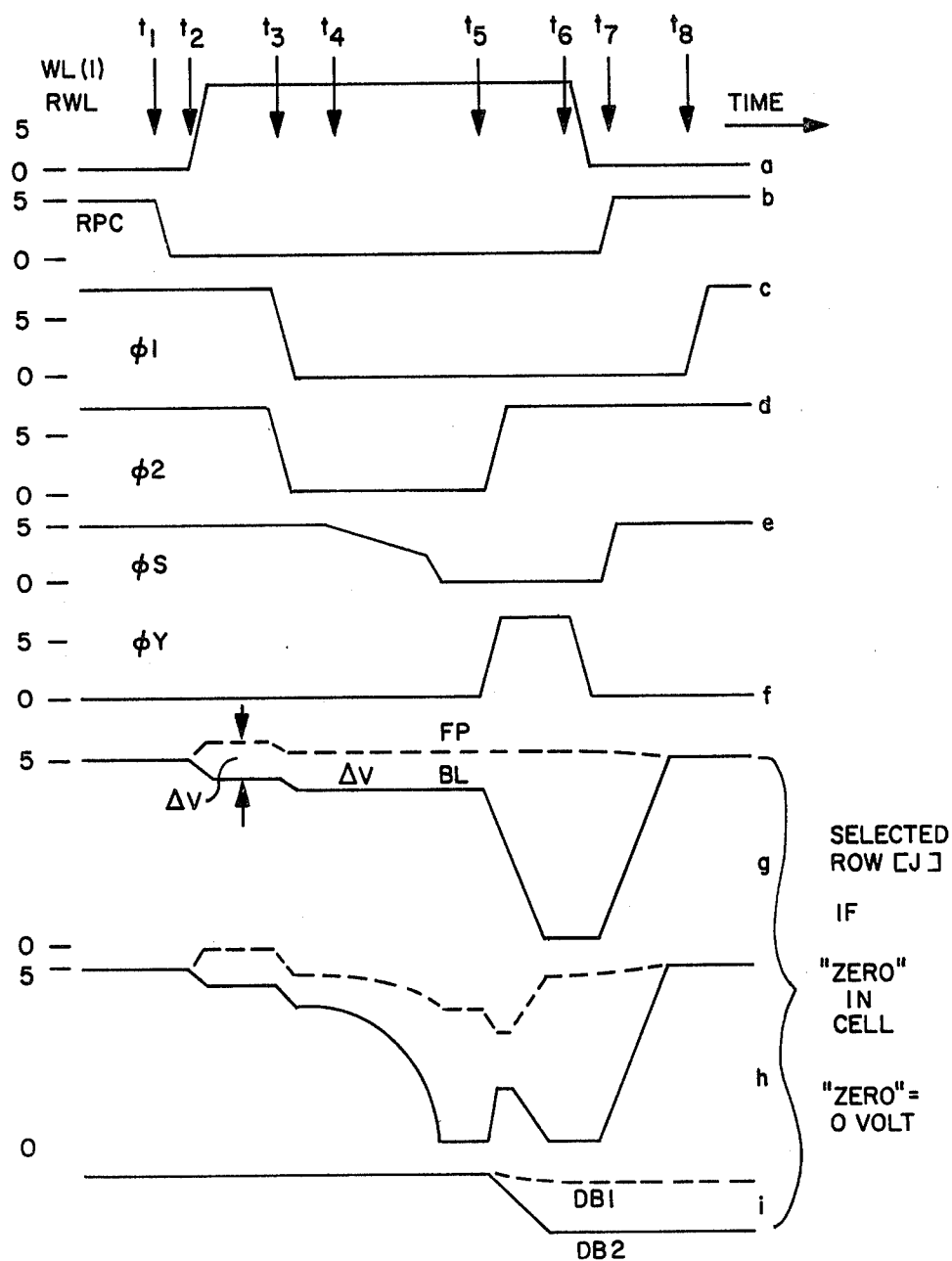
FIG. 2 is a diagram of waveforms illustrating a read operation for the memory cell and sensing array of FIG. 1.

At the start of a read operation the field plate lines FP, bit lines BL, the data bus pair DB1 and DB2 and the sense amplifier common node $\phi S$ are connected to the supply voltage $V_{cc}$ appearing on the power supply rail 16, in this example equal to 5V. Suppose it is desired to read the contents of cell (I,J). The read operation waveforms are shown in FIG. 2. At event time $t_1$ the bit lines BL and field plate lines FP are disconnected from the power supply rail 16 and left floating at 5V and the precharge line PC is at zero volts. Also, the reference cell reset line RPC is switched to zero volts, isolating the reference cell capacitor noded (I) through (M).

Immediately thereafter at event time $t_2$ the wordline WL(I) will be selected by the column decoder 14 and together with the reference wordline RWL switched to 7.5 V. Assume that the transistor threshold voltage is 1V. First consider the case of a "zero" in the memory cell (the memory cell node (I,J) has a voltage of zero volt). The cell node voltage will be raised to the bit line voltage. Because both the field plate line and the bit line capacitances ($C_{FP}$ and $C_{BL}$) are much larger than the memory cell capacitance C, the memory cell capacitor charge $CV_{cc}$ will be dumped on the field plate line FP(J), and the same but opposite charge will be extracted from the bit line BL(J). The charge on the reference cell capacitor ($\frac{1}{2}CV_{cc}$) to the contrary is dumped on the bit line BL(J) and extracted from the field plate line FP(J). As a result a net amount of charge of $\frac{1}{2}CV_{cc}$ is dumped on the field plate line FP(J) and extracted from the bit line BL(J). If $C_{FP}$ and $C_{BL}$ are equal, then the field plate line voltage is raised by a voltage amount $\frac{1}{2}\Delta V$ and the bit line voltage drops by the same amount $\frac{1}{2}\Delta V$. This sums up to a voltage difference $\Delta V$ between field plate line FP(J) and bit line BL(J). See FIG. 2 (g, h and i).

Now consider the case of a "one" in the cell. The cell node (I, J) has a voltage of 5 volts prior to event time $t_2$. In this case the memory cell capacitor (I,J) has no charge and thus will neither dump nor extract charge on the field plate line FP(J) and from the bit line BL(J). However, the reference cell capacitor 22 will still dump its charge on the bit line BL(J) and extract the same amount from the field plate line FP(J). The result is that the field plate line FP(J) and bit line BL(J) as well as the sense amplifier nodes 1 and 2 get an opposite voltage difference of $-\Delta V$. See FIG. 2 (j and k).

At event time $t_2$, lines $\phi 1$ and $\bar{\phi}1$ still have 7.5 volts. So also the sense amplifier nodes on each row differ by a voltage $\pm \Delta V$ according to the contents of the cell of the row and selected by column line I.

Both the field plate line FP and bit line BL of each row are disconnected from the sense amplifier nodes 1 and 2 at event time $t_3$. See FIG. 2 (c and d). At this time lines $\phi 1$ and $\phi 2$ are switched to zero volt. The voltage difference between the field plate line FP and bit line BL and also between the sense amplifier nodes 1 and 2 will stay constant but all nodes will experience a small but identical voltage dip because of capacitive coupling.

At event time $t_4$ the voltage difference $\Delta V$ between nodes 1 and 2 on each row is sensed and amplified by the sense amplifier by applying a proper "pull down" signal $\phi S$ on the common node of all sense amplifiers. See FIG. 2 (e, g, h, j and k). Then after sufficient time ($t_5$) the bit lines BL of all rows are reconnected to node 2 by line $\phi 2$. Just prior to time $t_5$ the data bus pair DB1 and DB2 are disconnected from the power supply $V_{cc}$ and are floating at 5V. On their part, nodes 1 and 2 of row I are connected to the data bus pair DB1 and DB2 by the decoded pulse $\phi Y(J)$. The status of the data bus pair voltage is further transmitted to the output pin by the data IO circuitry, see FIG. 2(f-1).

At the moment of connection of the bit line BL to node 2 by line $\phi 2$ in the rows not selected by row decode line $\phi Y(J)$ charge sharing takes place between the bit line BL and node 2, with the possibility arising of discharging node 1. This is shown in FIG. 2 (m and n). This can be minimized to acceptable levels by proper design. This is also the case for the selected row J, shown in FIG. 2 (h and k).

The pulses WL(I), RWL and $\phi Y(J)$ disappear at time $t_6$. See FIG. 2 (a and f). At this moment $t_6$ the contents of the cells in column I are restored to the levels that were present prior to reading.

At time $t_7$, the bit lines BL and field plate lines FP can be precharged and reconnected to the power supply $V_{CC}(=5V)$, and also the reference cell is reset by pulse RPC. See FIG. 2. Only then can the field plate line FP be reconnected to node 1 by a pulse on line $\phi 1$ at event time $t_8$. The field plate line FP voltage must not be allowed to drop considerably below the power supply voltage, or else the cell charge will be lost.

The write cycle is similar to the read operation in all the rows but the selected row (J). Suppose it is desired to "write" cell (I,J). Until event time $t_5$ the write operation of row (J) is the same as the read operation. In the read operation the status of the data bus pair DB1 and DB2 voltages is a result of the cell contents. In the write operation the status of the data bus pair DB1 and DB2 is forced from the data IO circuitry 42 and further transmitted to the cell (I,J). From then on the write operation is again similar to the read operation.

The memory array configuration is only one possibility out of several possibilities. This is the case also for the mode of operation and the timing of the waveforms. Moreover, there are other alternatives for the reference cell arrangement and the type of sensing circuitry, which will be apparent to those skilled in the art.

To illustrate the improvement in sensed signal output resulting from the invention, reference is now made to a typical memory cell and sense amplifier arrangement according to the prior art and a discussion thereof.

Figure 3:
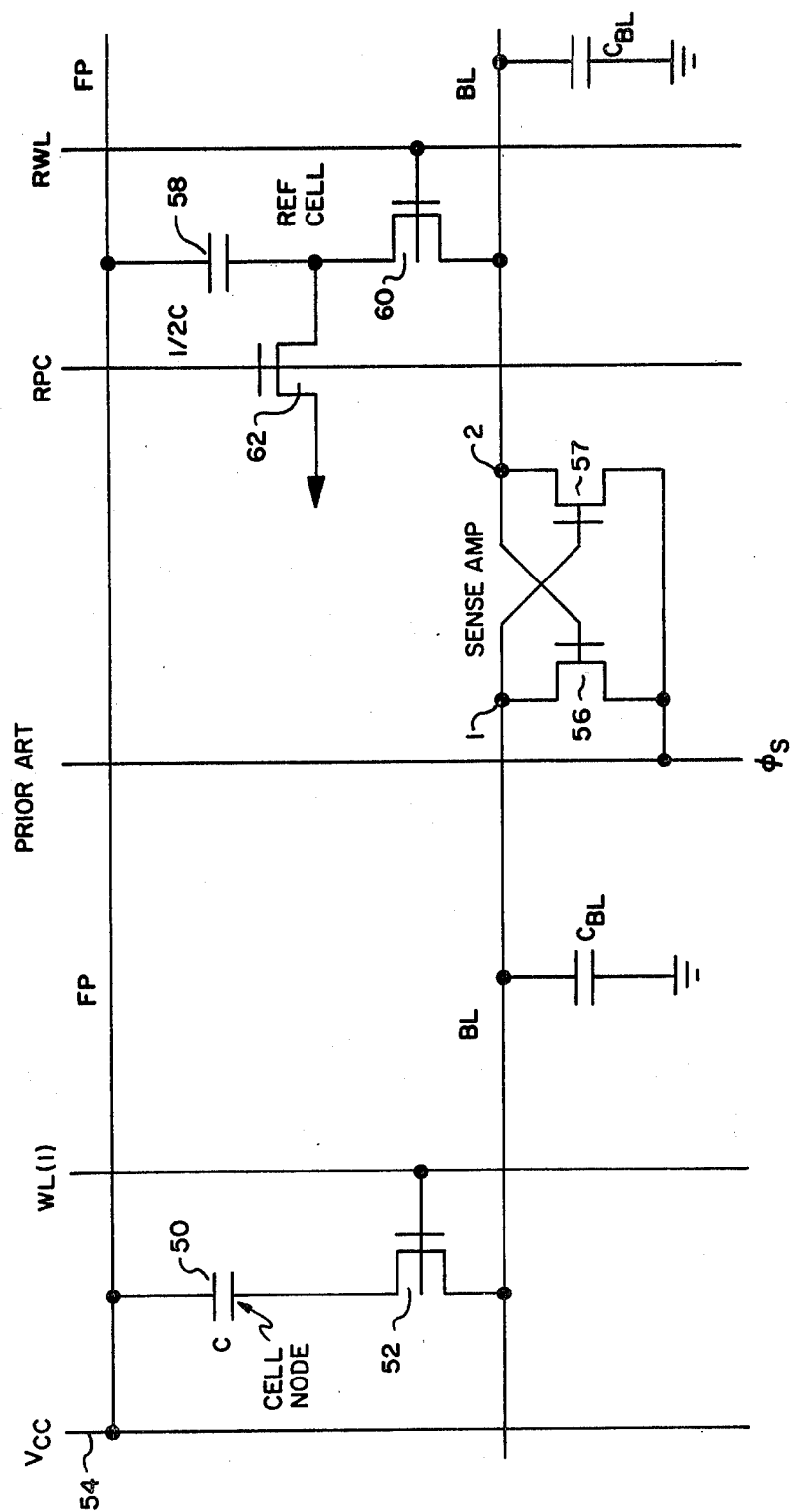
FIG. 3 is a schematic diagram of a portion of a memory cell array and sensing arrangement according to the prior art.

FIG. 3 shows a prior art memory cell and sense amplifier arrangement in which a memory cell includes a capacitor 50 and a transistor 52 connected in series across a field plate line FP and a bit line BL. Both the field plate line FP and bit line BL are connected directly to a power supply rail 54 that is furnished a supply voltage $V_{CC}$. The transistor 52 has its gate actuated by the word line WL(I), signifying selection of the Ith cell in an array.

The bit line BL is interrupted and has its memory cell side connected to one node 1 of a sense amplifier including cross coupled transistors 56 and 57 and has the other side connected to the other node 2 of the sense amplifier. On the second node 2 of the bit line BL a reference cell includes a reference capacitor 58 and a reference transistor 60 connected in series between the field plate line FP and bit line BL. The reference capacitor 58 has a capacitance value $\frac{1}{2}$ C and the memory cell capacitor 10 has a capacitance value C. The reference cell node is connected in series with a transistor 62, the gate of which is coupled to a reference cell preset line RPC. A reference word line RWL couples to the gate of the reference cell transistor 60. The bit line capacitance is shown labeled $C_{BL}$. A sense amplifier pull down line $\phi S$ is connected to the common side of the sense amplifier transistors 56 and 57.

In a read operation, suppose the lines WL(I), RWL, RPC and $\phi_S$ are operated along the same timing scheme as in FIG. 2. At event time $t_2$ both WL(I) and RWL are switched to 7.5 volts.

Suppose there is a zero in the memory cell, the cell node is at zero volts. Now at time $t_2$ the memory cell extracts the charge $CV_{cc}$ from the bit line BL, because $C_{BL}$ is $>>$ C. This causes a voltage drop of $-\Delta V$ on the bit line BL. The reference cell extracts the charge $\frac{1}{2}CV_{CC}$ from the bit line connected to the other side, node 2 side, of the sense amplifier, causing the voltage on this bit line to drop $-\frac{1}{2}\Delta V$. So the net voltage difference between the bit lines and across the sense amplifier is $\frac{1}{2}\Delta V$ after word line selection. At event time $t_4$ this signal is sensed and amplified by applying a proper pulldown pulse $\phi_S$.

In the field plate sensing technique according to the invention, there is achieved a voltage difference of $\Delta V$ across the sense amplifier, after word line selection, thereby improving the sense signal by a factor of 2. This is a very important improvement because in advanced dynamic memories the sense signals are marginally small at the present time.

What we claim is:

1. A memory array, comprising:
    (a) a plurality of memory cells arrayed in rows and columns;
    (b) a bit line and a field plate line for each row;
    (c) a word line for each column;
    (d) each memory cell including a memory cell transistor and a memory cell capacitor coupled in series between a bit line and a field plate line respectively, with the gates of the memory cell transistors in the same column coupled to a common word line;
    (e) a column including a reference cell capacitor and a reference cell transistor in each row coupled in series between the field plate line and the bit line, respectively, of the corresponding row;
    (f) a reference word line for said column in (e) coupled to the gates of said reference cell transistors;
    (g) a column including a sense amplifier in each row having means for coupling one input to the field plate line and the other input to the bit line of the corresponding row; and
    (h) means for connecting and disconnecting said field plate lines and said bit lines to and from a voltage supply for precharging them to the same d.c. potential.

2. The invention according to claim 1, and further including means for coupling the common nodes of said reference cell capacitors and reference cell transistors to a reference potential.

3. The invention according to claim 2, wherein said reference potential coupling means includes a common ground line, a field effect transistor connected between said common ground line and said common nodes, and a reference cell preset line connecting the gates of said field effect transistors in common.

4. The invention according to claim 1, wherein the sense amplifier coupling means in (g) includes a first field effect transistor in each row connected between said field plate line and said one input node, a second field effect transistor in each row connected between said bit line and said other input node, a field plate disconnect line connecting the gates of said first field effect transistors in all the rows in common, and a bit line disconnect line connecting the gates of said second field effect transistors in all the rows in common.

5. The invention according to claim 1, wherein the means in (h) includes a power supply rail, a first precharge transistor in each row connected between said power supply rail and the corresponding field plate line, a second precharge transistor in each row connected between said power supply rail and the corresponding bit line, and a precharge line connecting the gates of said first and second precharge transistors in common.

6. The invention according to claim 1, wherein the capacitance value of said reference cell capacitor is $\frac{1}{2}$ that of said memory cell capacitor.

* * * * *